United States Patent
Yoon et al.

(10) Patent No.: US 7,551,513 B2
(45) Date of Patent: Jun. 23, 2009

(54) SEMICONDUCTOR MEMORY DEVICE AND METHOD OF CONTROLLING SUB WORD LINE DRIVER THEREOF

(75) Inventors: Hong-Goo Yoon, Gyeonggi-do (KR); Jong-Eon Lee, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 320 days.

(21) Appl. No.: 11/342,161

(22) Filed: Jan. 26, 2006

(65) Prior Publication Data
US 2006/0171242 A1 Aug. 3, 2006

(30) Foreign Application Priority Data
Jan. 28, 2005 (KR) .................. 10-2005-0007969
Aug. 3, 2005 (KR) .................. 10-2005-0070859

(51) Int. Cl.
*G11C 8/00* (2006.01)
(52) U.S. Cl. .................. 365/230.06; 365/230.03
(58) Field of Classification Search ............ 365/185.23, 365/230.03 X, 230.06 O, 230.03, 230.06
See application file for complete search history.

(56) References Cited
U.S. PATENT DOCUMENTS

| 5,761,148 | A | 6/1998 | Allan et al. |
| 6,011,746 | A | 1/2000 | Oh |
| 6,026,047 | A | 2/2000 | Ryu et al. |
| 6,400,639 | B1 | 6/2002 | Ji et al. |
| 6,545,923 | B2 | 4/2003 | Sim et al. |
| 6,614,712 | B2 * | 9/2003 | Uchida et al. .......... 365/230.06 |

* cited by examiner

*Primary Examiner*—VanThu Nguyen
(74) *Attorney, Agent, or Firm*—Marger Johnson & McCollom, P.C.

(57) ABSTRACT

A semiconductor memory device includes a sub word line driver for selectively connecting one of sub word lines with a main word line and applying a boosted voltage having a level higher than a power source voltage to a selected sub word line. The device includes a sub word line driver control signal generator. The sub word line driver control signal generator receives an isolation signal applied to electrically insulate a sense amplifier from a bit line connected to memory cells constituting a memory cell array of the device, and generates a driver control signal for determining whether the sub word line driver operates or not. Thereby, a load of sub word line driver control signal generator can be reduced and so power consumption is reduced.

6 Claims, 8 Drawing Sheets

SEMICONDUCTOR MEMORY DEVICE AND METHOD OF CONTROLLING SUB WORD LINE DRIVER THEREOF

BACKGROUND OF THE INVENTION

This application claims the benefit of Korean Patent Application Nos. 2005-07969, filed Jan. 28, 2005, and 2005-70859, filed Aug. 3, 2005, the disclosures of which are hereby incorporated herein by reference in their entirety.

1. Field of the Invention

The present invention relates to a semiconductor memory device, and more particularly, to a sub word line driver control signal generator and a control method thereof, to control a sub word line driver of a sub word line connected to a memory cell in a semiconductor memory device.

2. Description of the Related Art

In general, since a DRAM (Dynamic Random Access Memory) tends to have a large capacity, time taken to transfer a signal is more due to a wiring impedance delay than to a delay time of memory cell array itself. Thus, it has been necessary to match with a delay time by appropriately dividing a length of wire, so that a word line to select a row from a memory cell array is appropriately divided.

A word line is connected to a gate terminal of a transistor of a memory cell, and is generally formed of polysilicon. A specific resistance of polysilicon is considerably larger than that of metal. Further since a word line passes over a gate oxide of a cell transistor, capacitance is also very large. When resistance of a word line becomes large, an RC delay increases. A decoder output terminal for driving a word line should be large; thus, area consumption also increases, and much power is consumed in charging an overall word line to a high voltage and in discharging it. Thus, it is required to impedance match with a length of word line and reduce word line resistance.

To solve this problem a hierarchical word line driving method is used, in which a word line is divided into proper lengths to form sub word lines. Then the sub word lines are driven by a composition between a main word line of a row decoder and a sub word line of a sub word line driver.

A semiconductor memory device having such a hierarchical word line structure according to the prior art will be described, referring to FIGS. 1 to 3, as follows.

FIG. 1 is a block diagram and FIGS. 1A and 1B are circuit diagrams of regions thereof schematically illustrating a semiconductor memory device having a sub word line driver control signal generator (hereinafter, referred to as 'SWD control signal generator') according to the prior art. FIG. 2 is a circuit diagram illustrating in detail a connection between a sense amplifier region SAs 20 of FIG. 1 and the SWE control signal generator PXID_GEN. FIG. 3 is an equivalent circuit diagram of the SWD control signal generator PXID_GEN shown in FIG. 2.

Referring first to FIGS. 1, 1A and 1B, a semiconductor memory device according to the prior art includes a memory cell array MCA 14, a main word line decoder 12, a sense amplifier region 20, an SWD control signal generator region 18 and an SWD region containing SWDs 16.

In the memory cell array 14 (FIG. 1A), there are a plurality of memory cells MC and bit lines BL and BLB connected to the memory cells MC. Each memory cell MC is positioned at an intersection of a sub word line SWL and a bit line BL or BLB.

The main word line decoder 12 receives a specific address, e.g., RA2~RA8, among inputted row addresses, then decodes it and supplies a boosted voltage VPP having a level higher than a power source voltage VDD to one main word line of a plurality of main word lines MWLs.

The sense amplifier region 20 (FIG. 1B) is positioned between memory cell arrays and has a plurality of sense amplifiers SAs to sense and amplify signals of bit lines BL and BLB.

The sub word line driver region 16 is positioned between memory cell arrays, and has a plurality of sub word line drivers SWDs driven by an SWD control signal PXID and an MWL signal.

The SWD control signal generator region 18 (FIG. 1B) is positioned between the sense amplifier regions, namely, at a conjunction region CONJ, and generates the SWD control signal PXID.

The SWD control signal generator PXID_GEN receives a sub word line decoding signal PXI generated by a sub word line decoder PXI_GEN 11, and applies the SWD control signal PXID to a corresponding sub word line driver SWD. The sub word line decoder PXI_GEN 11 receives specific row addresses, e.g., RA0 and RA1, and decodes them and generates a plurality of decoding signals PXI.

Referring to FIG. 2, there are a sense amplifier region 20 shown in more detail, a memory cell arrays 14a, 14b and an SWD control signal generator PXID_GEN and a plurality of sub word line drivers SWDs. Herewith, there is shown only one of two sub word line decoding signals PXI shown in FIG. 1, which is applied to the SWD control signal generator PXID_GEN.

In the sense amplifier region 20, a plurality of sense amplifiers SA and bit line isolation parts 24 and 26 are provided. The sense amplifiers SAs in the sense amplifier region 20 are electrically connected to one bit line pair BL, BLB among bit line pairs BL, BLB connected to memory cells (MC of FIG. 1) of adjacent memory cell arrays 14a, 14b, by using an isolation signal BISL or BISR, to sense and amplify a level of signal loaded on the connected bit line pair.

For example, when a sub word line SWL of a memory cell array 14b is activated, an isolation signal BISR becomes a high level and an isolation signal BISL becomes a low level. That is, transistors TR1, TR2, TR3 and TR4 of the bit line isolation part 24 positioned between a bit line pair BL, BLB of the memory cell array 14b and the plurality of sense amplifiers SAs are turned on. Thus, the bit line pair BL, BLB of the memory cell array 14b side is electrically connected to the sense amplifiers SAs. Meanwhile, transistors TR11, TR12, TR13 and TR14 of the bit line isolation part 26 positioned between a bit line pair BL, BLB of the memory cell array 14a and the plurality of sense amplifiers SAs are turned off. Thus, the connection between the bit line pair BL, BLB of the memory cell array 14a and the sense amplifier SA is cut off. Such a layout system, in which two adjacent memory cell arrays share one sense amplifier region, is called a shared sense amplifier system. This system is widely used with merits of reducing an area of sense amplifier, thus being applicable to a high integration.

With reference to FIG. 3, an SWD control signal generator PXID_GEN receives a sub word line decoding signal PXI and generates an SWD control signal PXID. When the sub word line decoding signal PXI has a high level, the SWD control signal PXID becomes a boosted voltage VPP by operation of inverters INV1, INV2 on the SWD control signal generator PXID_GEN. The inverters INV1 and INV2 are individually constructed of a pair of P-type MOS (Metal Oxide Semiconductor) transistor PM1, PM2 and N-type MOS transistor NM1, NM2. In other words, INV1 is constructed of PM1 and NM1, and INV2 is constructed of PM2 and NM2.

The SWD control signal PXID controls a plurality of sub word line drivers SWD provided in the sub word line driver region 16 (FIGS. 1A, 1B). For example, the sub word line driver is activated by a main word line MWL activated by a main word line decoder 12 and the activated SWD control signal PXID, to activate a sub word line SWL with a boosted voltage VPP having a level higher than a power source voltage VDD.

In such semiconductor memory device, for example, in the case that sub word lines corresponding to a memory cell array 14b are activated in FIG. 2, one sub word line of the sub word lines corresponding to the memory cell array 14b is activated in response to a signal applied to a main word line MWL and a sub word line decoding signal PXI so as to select a memory cell within the memory cell array 14b. In this case, it is unnecessary to apply an SWD control signal PXID to memory cell array 14a.

However, the SWD control signal PXID of FIG. 2 enables the plurality of sub word line drivers SWD corresponding to the cell arrays 14a and 14b positioned on both sides of the sense amplifier SA.

In other words, a load of the SWD control signal generator PXID_GEN is very large, and this causes much power consumption in activating the SWD control signal PXID, and particularly, badly influences an operating characteristic of mobile equipment, etc. that require a low power consumption.

SUMMARY OF THE INVENTION

An exemplary embodiment of the invention provides a semiconductor memory device capable of reducing a load of a sub word line driver control signal generator. The semiconductor memory device can be high-density and high-integrated by substantially reducing the number of specific signal lines and circuit devices, and can have reduced power consumption.

Another exemplary embodiment of the invention provides a sub word line driver control method capable of reducing a load of sub word line driver control signal generator.

BRIEF DESCRIPTION OF THE DRAWINGS

The above and other features of exemplary embodiments of the invention will become readily apparent from the description that follows, with reference to the attached drawings in which:

FIG. 1 is a block diagram and FIGS. 1A and 1B are circuit diagrams schematically illustrating a semiconductor memory device having a SWD control signal generator according to a prior art;

DETAILED DESCRIPTION OF THE INVENTION

Exemplary embodiments of the invention are more fully described in detail with reference to FIGS. 4 to 6. The invention may be embodied in many different forms and should not be construed as being limited to the exemplary embodiments set forth herein. Rather, these exemplary embodiments are provided so that this disclosure is thorough and complete, and to convey the concepts of the invention to those skilled in the art.

Figure 4:
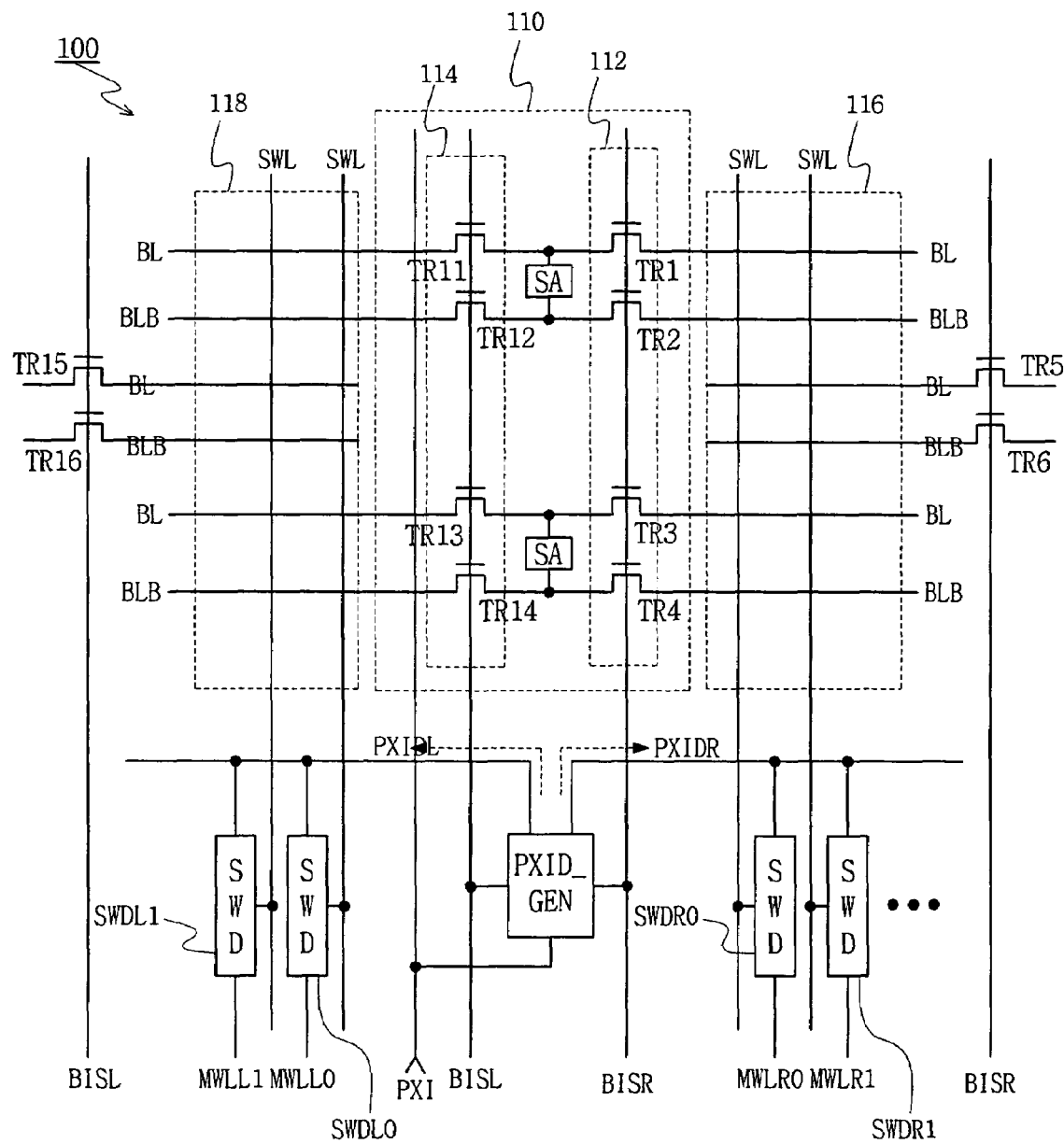
FIG. 4 is a circuit diagram illustrating a structure of semiconductor memory device having an SWD control signal generator according to an exemplary embodiment of the invention.

FIG. 4 is a circuit diagram illustrating a structure of semiconductor memory device having a sub word line driver (SWD) control signal generator PXID_GEN according to an exemplary embodiment of the invention.

Referring to FIG. 4, a semiconductor memory device 100 according to an exemplary embodiment includes a memory cell array 116, 118, a shared sense amplifier 110, a sub word line driver control signal generator PXID_GEN and a sub word line driver SWD.

Figure 2:
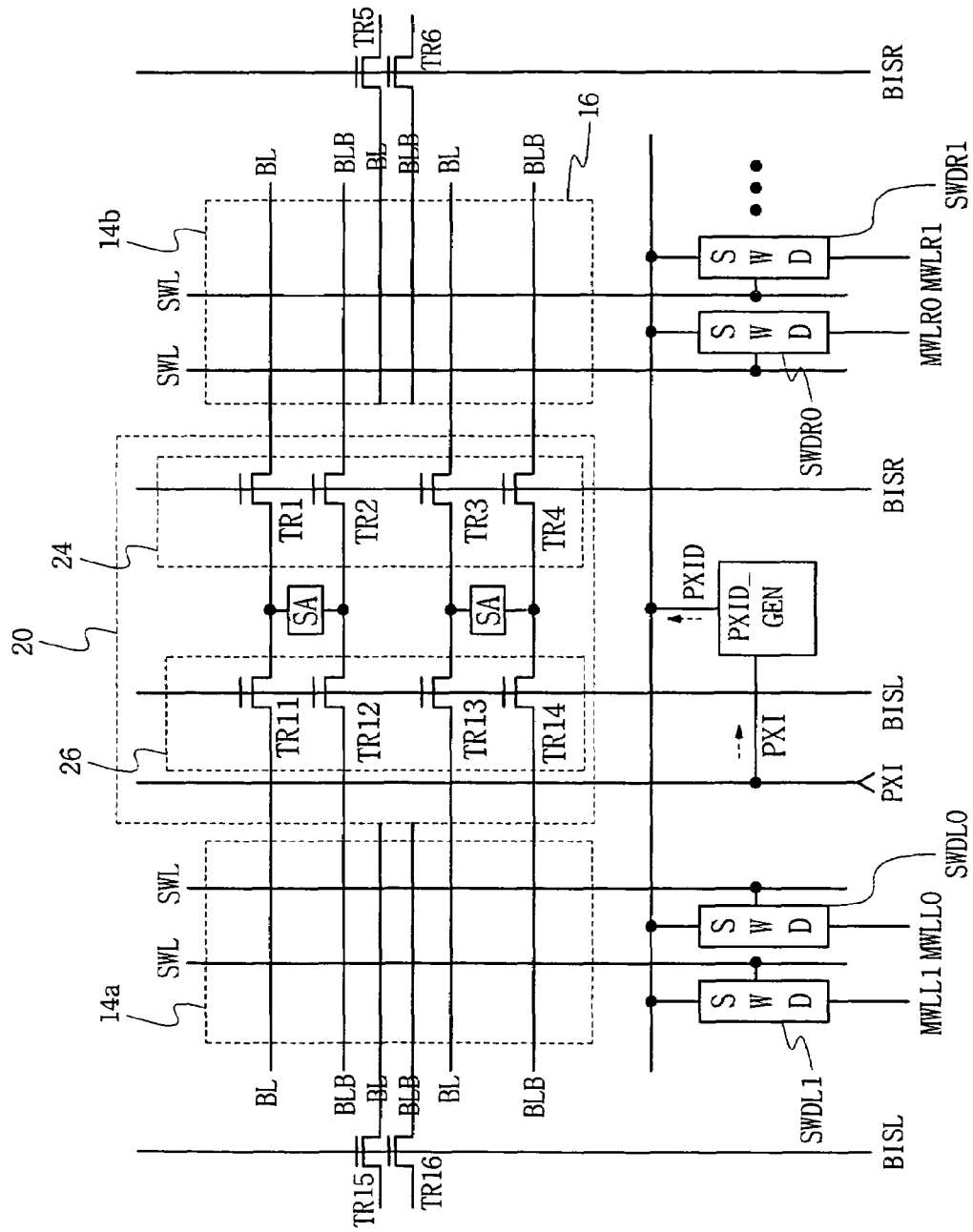
FIG. 2 is a circuit diagram illustrating in detail a connection between a sense amplifier region and a sub word line driver (SWD) control signal generator shown in FIG. 1.
Figure 3:
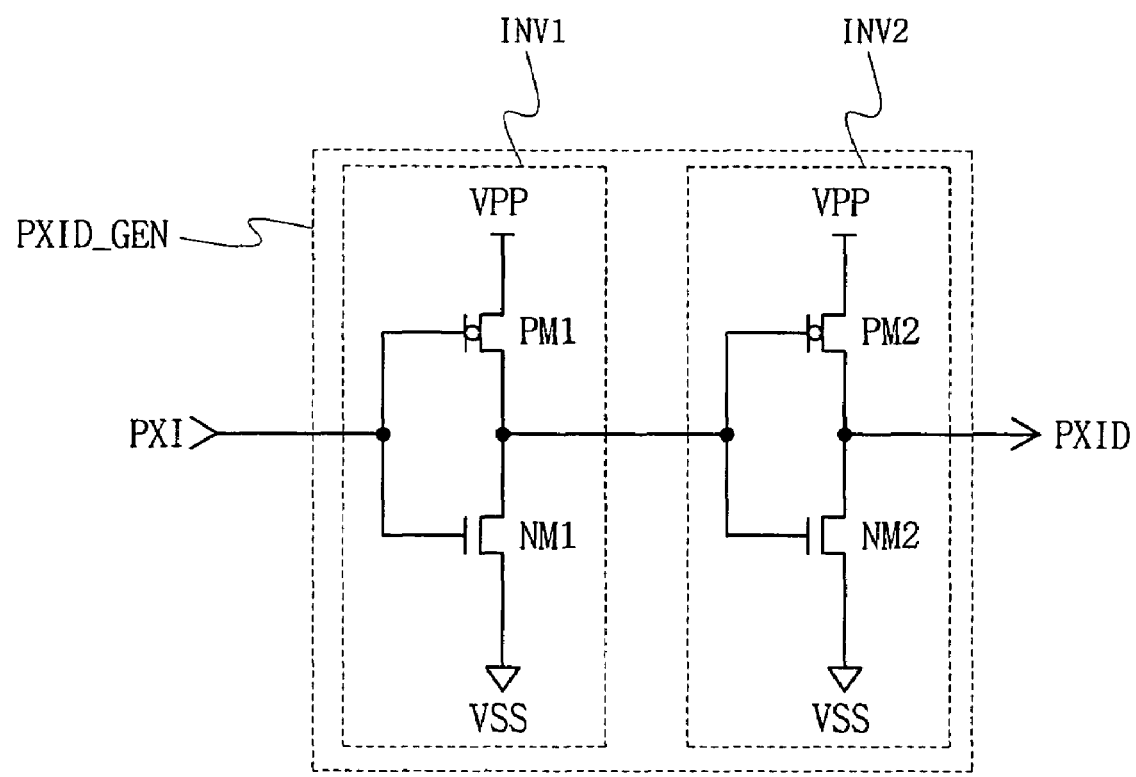
FIG. 3 is a circuit diagram of an SWD control signal generator shown in FIG. 2.

The memory cell array and the shared sense amplifier have the same configuration as that of FIG. 2, thus a detailed description will be omitted in the following.

The SWD control signal generator PXID_GEN each outputs a first sub word line drive signal PXIDL and a second sub word line drive signal PXIDR in response to a sub word line decoding signal PXI and isolation signals BISL, BISR.

The sub word line driver (SWE) includes sub word line drivers SWDL that respond to main word line signals MWLL0~n and first sub word line drive signal PXIDL, and sub word line drivers SWDR that respond to main word line signals MWLR0~n and second sub word line drive signal PXIDR.

Figure 5:
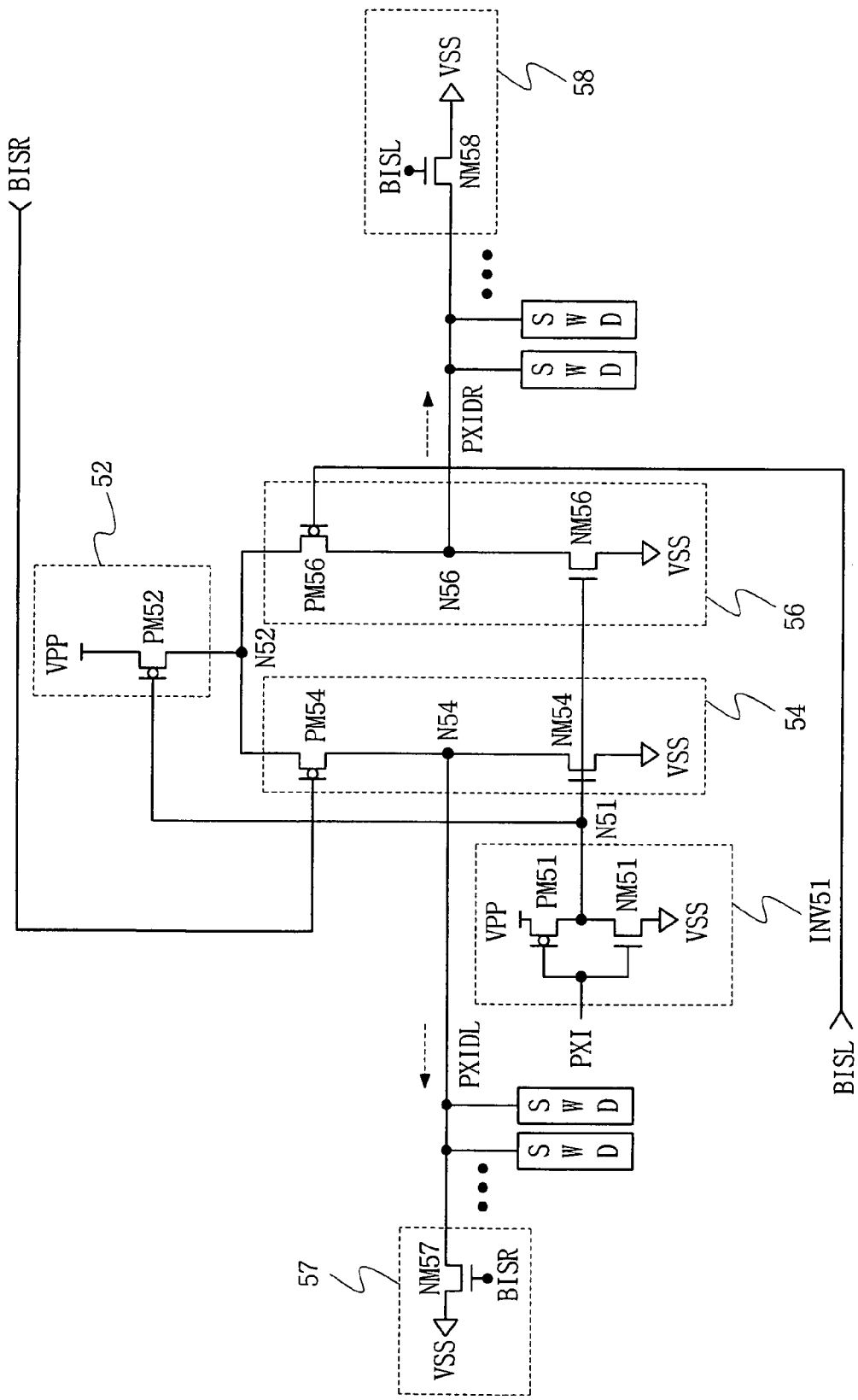
FIG. 5 is a circuit diagram of a SWD control signal generator according to a first exemplary embodiment of the invention.

FIG. 5 is a circuit diagram illustrating in detail an SWD control signal generator PXID_GEN according to a first exemplary embodiment of the invention.

Referring to FIGS. 4 and 5, the SWD control signal generator PXID_GEN includes a boosted voltage supply part 52, a first sub word line drive control signal output part 54, a second sub word line drive control signal output part 56 and floating preventing parts 57, 58.

Figure 1A:
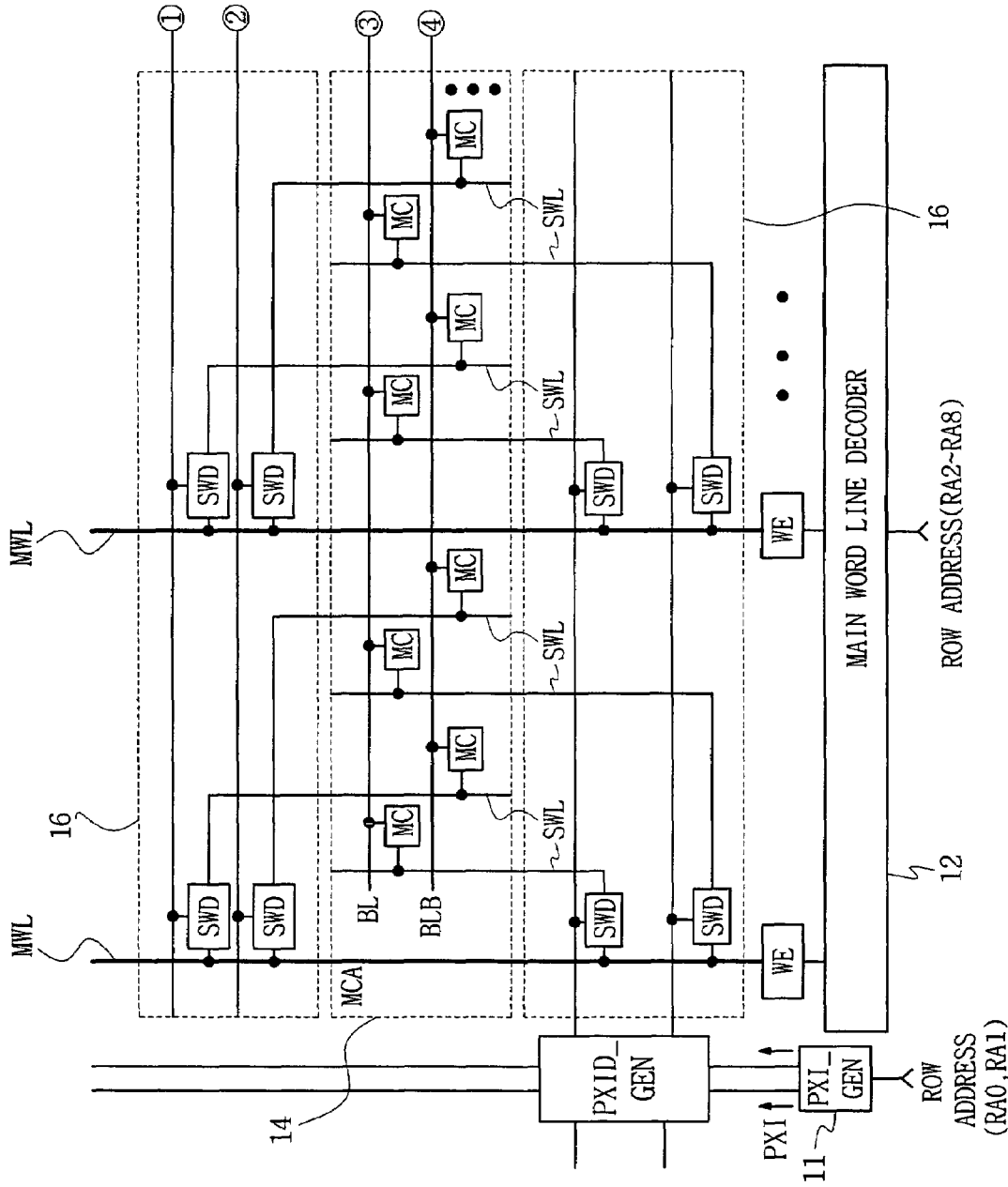
Figure 1B:
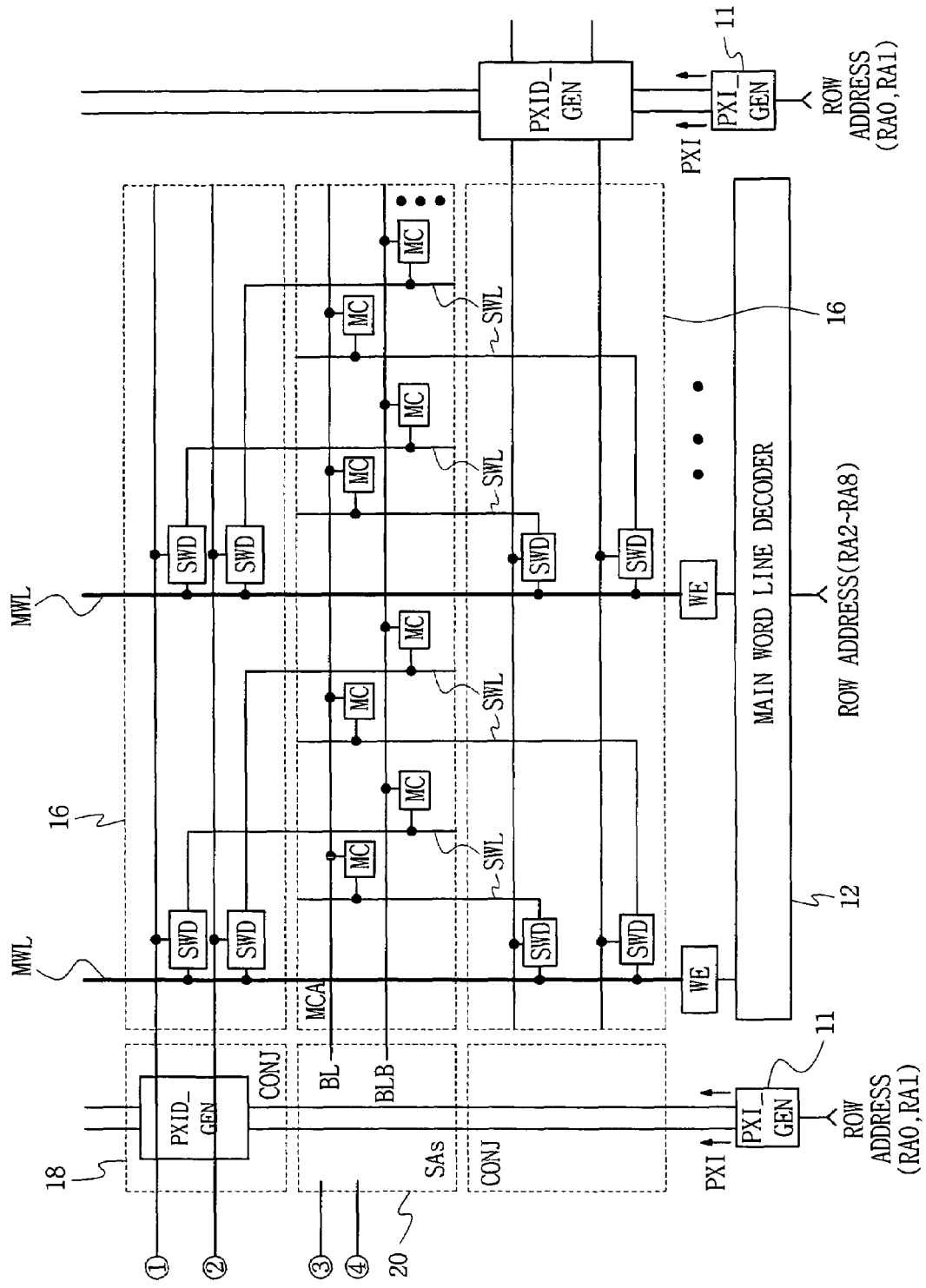

The boosted voltage supply part 52 outputs a boosted voltage VPP having a level higher than a power source voltage |VDD| to the first sub word line drive control output part 54 and the second sub word line drive control signal output part 56 when a sub word line decoding signal PXI has a high level. That is, when the sub word line decoding signal PXI has a high level, a voltage of node N51 becomes a low level according as the sub word line decoding signal PXI is inverted by an inverter INV51. A P-type MOS transistor PM52 of the boosted voltage supply part 52 is turned on by the voltage of the node N51, to output the boosted voltage VPP to a node N52. The node N52 has an applied source voltage of the first sub word line drive control signal output part 54 and the second sub word line drive control signal output part 56. The sub word line decoding signal PXI is a signal outputted from the sub word line decoding signal generator PXI_GEN of FIG. 1 for receiving specific row addresses, e.g., upper row addresses (RA0 and RA1 of FIG. 1), and then decoding them.

The first sub word line drive control signal output part 54 includes a first P-type MOS transistor PM54 and a first N-type MOS transistor NM54. An isolation signal BISR to cut off signal flow between the sense amplifier SA of FIG. 4 and sub memory cell arrays 116 and 118, among isolation signals BISL and BISR, is applied to a gate terminal of the first P-type MOS transistor PM54. A voltage of node N52 as an output voltage of the boosted voltage supply part 52 is applied to a source terminal of the first P-type MOS transistor PM54. A drain terminal of the first P-type MOS transistor PM54 is connected to a drain terminal of the first N-type MOS transistor NM54. An inversion signal of the sub word line decoding signal PXI is applied to a gate terminal of the first N-type MOS transistor NM54, and a ground voltage VSS is applied to a source terminal of the first N-type MOS transistor NM54. The inversion signal of the sub word line decoding signal PXI is generated from an inverter INV51 for receiving the sub word line decoding signal PXI and outputting an inverted signal. Thus, the first sub word line drive control signal PXIDL is outputted from a node N54 between a drain terminal of the first P-type MOS transistor PM54 and a drain terminal of the first N-type MOS transistor NM54.

The second sub word line drive control signal output part 56 includes a second P-type MOS transistor PM56 and a second N-type MOS transistor NM56. An isolation signal BISL to connect signal flow between the sense amplifier SA and sub memory cell arrays 116 and 118, among the isolation signals BISL and BISR, is applied to a gate terminal of the second P-type MOS transistor PM56. A voltage of node N56 as an output voltage of the boosted voltage supply part 52 is applied to a source terminal of the second P-type MOS transistor PM56. A drain terminal of the second P-type MOS transistor PM56 is connected to a drain terminal of the second N-type MOS transistor NM56. An inversion signal of the sub word line decoding signal PXI is applied to a gate terminal of the second N-type MOS transistor NM56, and a ground voltage VSS is applied to a source terminal of the second N-type MOS transistor NM56. Thus, the second sub word line drive control signal PXIDR is outputted from a node N56 between a drain terminal of the second P-type MOS transistor PM56 and a drain terminal of the second N-type MOS transistor NM56.

For example, when the sub word line decoding signal PXI has a high level, and second isolation signal BISR has a low level and first isolation signal BISL has a high level; node N51 becomes a low level and a P-type MOS transistor PM52 of the boosted voltage supply part is turned on, and the first P-type MOS transistor PM54 also is turned on. A second P-type MOS transistor PM56 is turned off, and first and second N-type MOS transistors NM54 and NM56 are turned off. Thus, a node N54 of first sub word line drive control signal output part 54 becomes a boosted voltage VPP, and a node N56 of second sub word line drive control signal output part 56 maintains an existing voltage. In this instance, the existing voltage indicates a state when the sub word line decoding signal PXI has a low level and the second N-type MOS transistor NM56 is turned on, so that node N56 of second sub word line drive control signal output part 56 has a ground voltage VSS. Then, a boosted voltage VPP is provided to sub word line drivers (SWDL0 and SWDL1 of FIG. 4) corresponding to a sub memory cell array that is connected to sense amplifiers through the first isolation signal BISL, and the sub word line drivers (SWDL0 and SWDL1 of FIG. 4) corresponding to the sub memory cell array coupled with the sense amplifiers are activated. In the meantime, a second sub word line drive control signal PXIDR becomes a ground voltage VSS. In other words, sub word line drivers (SWDR0 and SWDR1 of FIG. 4) corresponding to a sub memory cell array that is disconnected from sense amplifiers through a second isolation signal BISR are not activated.

The floating preventing parts 57, 58 prevent whichever of the sub word line drive control signal output parts 54 and 56 that has no supply of boosted voltage VPP from floating.

The first floating preventing part 57 provides a reference voltage to the node N54, when the second sub word line drive control signal output part outputs a boosted voltage VPP, which is when node N56 has a boosted voltage VPP and node N54 becomes a floating state. In other words, the first floating preventing part 57 is controlled by second isolation signal BISR, |the second isolation signal BISR being applied for connecting signal flow between the sub memory cell array and the sense amplifier, |and provides a reference voltage to the node N54 when the first P-type MOS transistor PM54 is not turned on. In this instance, the reference voltage can be a ground voltage VSS.

A second floating preventing part 58 provides a reference voltage to the node N56, when the first sub word line drive control signal output part 54 outputs a boosted voltage VPP, which is when a node N54 has a boosted voltage VPP and a node N56 becomes a floating state. In other words, the second floating preventing part 58 provides a reference voltage to the node N56 when the second P-type MOS transistor is not turned on, and so prevents a floating of the node N56 when the second P-type MOS transistor PM56 is turned off. In this instance, the reference voltage can be a ground voltage VSS.

The first floating preventing part 57 and the second floating preventing part 58 can be formed in a portion of a conjunction region not occupied by the SWD control signal generator PXID_GEN, preferably adjacent to a region where the sense amplifier is formed.

The first floating preventing part 57 and the second floating preventing part 58 individually include an N-type MOS transistor NM57 controlled by second isolation signal BISR and an N-type MOS transistor NM58 controlled by a first isolation signal BISL. |For example, the first floating preventing part 57 is connected to the node N54 of the first sub word line drive control signal output part 54, and provides a reference voltage, when second isolation signal BISR has a high level and the P-type MOS transistor PM54 of the first sub word line drive control signal output part 54 is turned off so that the node N54 of the first sub word line drive control signal output part 54 does not become a floating state. |In other words, N-type MOS transistor NM57 of the first floating preventing part 57 is controlled by second isolation signal BISR for |connecting signal flow between the sense amplifier and the sub memory cell array, and provides a reference voltage to node N54 of the first sub word line drive control signal output part 54. In this case, the second floating preventing part 58 is controlled by first isolation signal BISL and so does not provide a reference voltage to node N56 of the second sub word line drive control signal output part 56. The node N56 does not become a floating state since the P-type MOS transistor PM56 of the second sub word line drive control signal output part 56 is turned on.

As described above, a reference voltage is supplied where boosted voltage VPP is not applied to. Thus, a sub word line drive control signal output part does not become a floating state. In other words, sub word line drivers connected to that part are not activated by an optional floating voltage.

Figure 6:
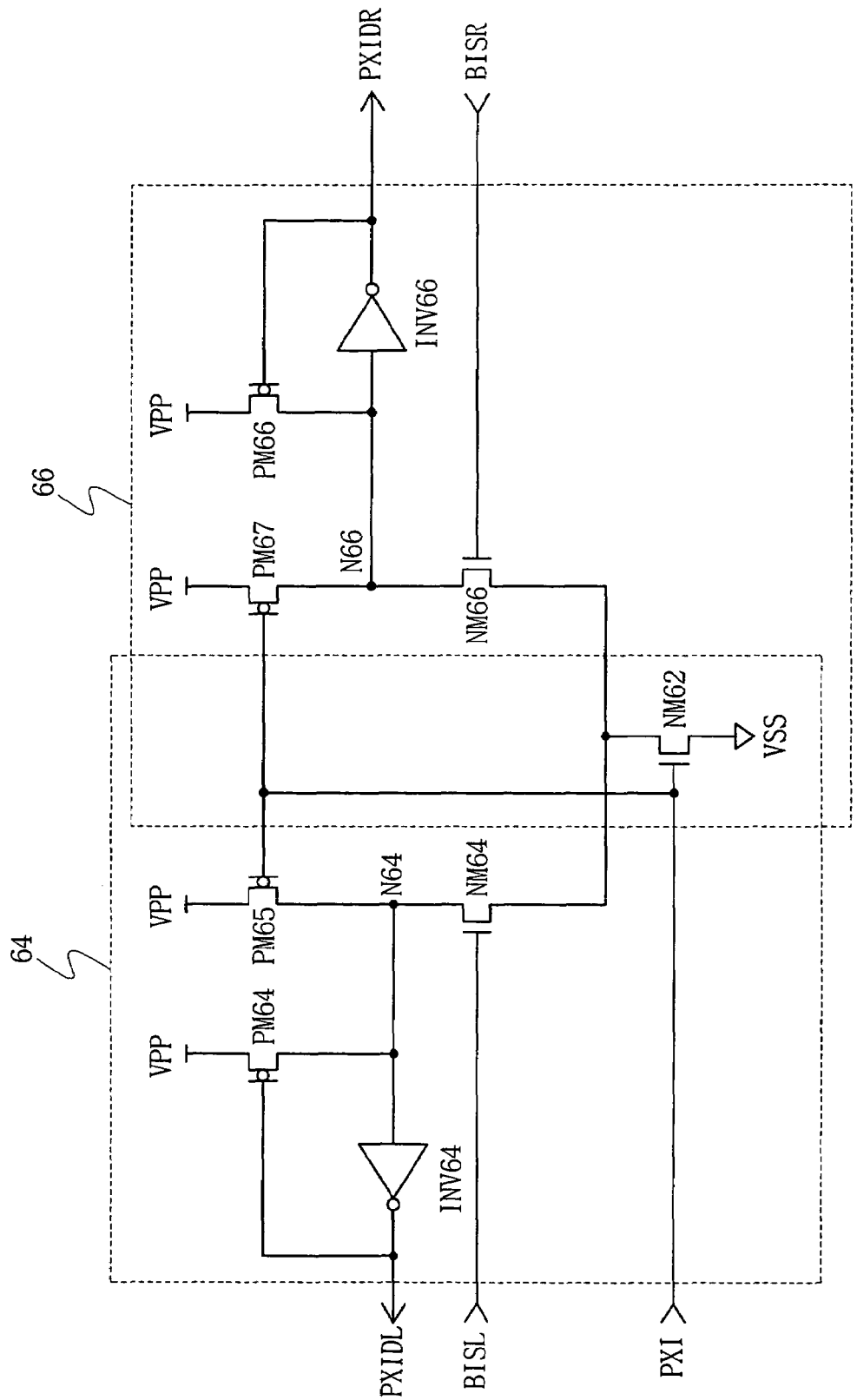
FIG. 6 is a circuit diagram of a SWD control signal generator according to a second exemplary embodiment of the invention.

FIG. 6 is a circuit diagram of SWD control signal generator PXID_GEN according to a second exemplary embodiment of the invention.

Referring to FIGS. 4 and 6, the SWD control signal generator PXID_GEN uses a first isolation signal BISL and a second isolation signal BISR. The first isolation signal BISL connects one array 118, of multiple sub memory cell arrays |with| the sense amplifier SA. The second isolation signal BISR disconnects a sub memory cell array 116 from the sense amplifier. The SWD control signal generator PXID_GEN drives sub word line drivers SWDL0 and SWDL1 corresponding to the sub memory cell array 118 that is connected to the sense amplifier SA but does not drive sub word line drivers SWDR0 and SWDR1 corresponding to the sub memory cell array 116 that is not connected to the sense amplifier SA.

The SWD control signal generator PXID_GEN includes a first sub word line drive control signal output part 64 and a second sub word line drive control signal output part 66.

The first sub word line drive control signal output part 64 receives the first isolation signal BISL, and provides a first sub word line drive control signal PXIDL to sub word line drivers SWDL0 and SWDL1 corresponding to the sub memory cell array 118 that is connected to the sense amplifier SA. The first sub word line drive control signal PXIDL is a boosted voltage VPP, and drives sub word line drivers SWDL0 and SWDL1 corresponding to the sub memory cell array 118 that is connected to the sense amplifier SA, and respectively drives sub word lines SWL connected with them.

The first sub word line drive control signal output part 64 includes a first N-type MOS transistor NM64, a first P-type MOS transistor PM65, a second P-type MOS transistor PM64 and a first inverter INV64.

The first N-type MOS transistor NM64 is turned on by the first isolation signal BISL when a sub word line decoding signal PXI that selects memory cells of a sub memory cell array connected to the sense amplifier SA has a high level. Thus a first node N64 has a ground voltage VSS, the first node N64 being a node between a drain terminal of first P-type MOS transistor PM65 and a drain terminal of second P-type MOS transistor PM64.

The first inverter INV64 receives a voltage of the first node N64, and outputs the first sub word line drive control signal PXIDL.

The sub word line decoding signal PXI is applied to a gate terminal of the first P-type MOS transistor PM65, and a boosted voltage VPP having a level higher than a power source voltage VDD is applied to a source terminal.

The first sub word line drive control signal PXIDL is applied to a gate terminal of the second P-type MOS transistor PM64, and a boosted voltage VPP is applied to a source terminal. In other words, the gate terminal of the second P-type MOS transistor PM64 is connected to an output terminal of the first inverter INV64.

When the sub word line decoding signal PXI has a low level so that the first P-type MOS transistor PM65 is turned on, the first node N64 becomes boosted voltage VPP. The first sub word line drive control signal PXIDL becomes a low level by the first inverter INV64.

The second sub word line drive control signal output part 66 receives the second isolation signal BISR, and provides a second sub word line drive control signal PXIDR to sub word line drivers SWDR0 and SWDR1 corresponding to the sub memory cell array 116 that is ldisconnected from the sense amplifier SA.

The second sub word line drive control signal PXIDR is an inversion signal of node N66 of the second sub word line drive control signal output part 66 when a sub word line decoding signal PXI that selects memory cells of the sub memory cell array 118 coupled with the sense amplifier SA has a low level before becoming a high level. That is, the second word line drive control signal PXIDR has a low level, and the sub word line drivers SWDR0 and SWDR1 connected to the second sub word line drive control signal PXIDR are not driven.

The second sub word line drive control signal output part 66 includes a second N-type MOS transistors NM66, a third P-type MOS transistor PM67, a fourth P-type MOS transistor PM66 and a second inverter INV66.

The second N-type MOS transistor NM66 is turned off by the second isolation signal BISR when a sub word line decoding signal PXI that selects memory cells of a sub memory cell array connected to the sense amplifier SA switches from a low to a high level. Thus, a second node N66 has a boosted voltage VPP, the second node N66 being a node between a drain terminal of third P-type MOS transistor PM67 and a drain terminal of fourth P-type MOS transistor PM66.

The second inverter INV66 receives a voltage of the second node N66 and outputs the second sub word line drive control signal PXIDR.

The sub word line decoding signal PXIDR is applied to a gate terminal of the third P-type MOS transistor PM67, and a boosted voltage VPP having a level higher than power source voltage VDD is applied to a source terminal.

The second sub word line drive control signal PXI is applied to a gate terminal of the fourth P-type MOS transistor PM66, and a boosted voltage VPP is applied to a source terminal. That is, a gate terminal of the fourth P-type MOS transistor PM66 is connected to an output terminal of the first inverter INV66.

When the sub word line decoding signal PXI switches from a low level to a high level while the second isolation signal BISR has a low level, the second node N66 maintains a boosted voltage VPP. That is, the second node N66 continuously maintains the boosted voltage VPP provided when the sub word line decoding signal PXI was a low level. In this way, it is possible to prevent the second node N66 from becoming a floating state and not to let the second word line drive control signal PXIDR reach a voltage level that will drive sub word line drivers (SWDR0 and SWDR1 of FIG. 6) connected to the second sub word line drive control signal output part 66. The second sub word line drive control signal PXIDR becomes a low level by operation of the second inverter INV66.

Operation of the SWD control signal generator PXID_GEN according to the second exemplary embodiment will be described as follows.

When sub word line decoding signal PXI has a low level, an N-type MOS transistor NM62 is turned off, and a first P-type MOS transistor PM65 and a third P-type MOS transistor PM67 are turned on. Nodes N64 and N66 become boosted voltages VPP, and the voltages of the nodes N64 and N66 are inverted by inverters INV64 and INV66, and first and second sub word line drive control signals PXIDL and PXIDR become a low level. In this case, all sub word line drivers SWD connected to the first and second sub word line drive control signal output parts 64 and 66 do not operate.

When the sub word line decoding signal PXI switches from a low to a high level while first isolation signal BISL has a high level and second isolation signal BISR has a low level, the first and second sub word line drive control signal output parts 64 and 66 operate mutually differently.

First, looking over the first sub word line drive control signal output part 64, the first P-type MOS transistor PM65 is turned off and the first N-type MOS transistor NM64 is turned on so that first node N64 becomes a ground voltage VSS. First inverter INV64 receives a ground voltage VSS of the first node N64, and outputs an inverted signal as the first sub word line drive control signal PXIDL. The first sub word line drive control signal PXIDL can beneficially be a boosted voltage VPP. In this case, second P-type MOS transistor PM64 is in a turn off state.

Next, looking over the second sub word line drive control signal output part 66, the third P-type MOS transistor PM67 is turned off and second N-type MOS transistor NM66 is also turned off. Thus, second node N66 maintains a boosted voltage VPP which is the supplied voltage when the sub word line decoding signal PXI is a low level. The second inverter INV66 receives a boosted voltage VPP of the second node N66, and outputs an inverted signal as second sub word line drive control signal PXIDR. The second sub word line drive control signal PXIDR is applied to a gate terminal of the fourth P-type MOS transistor PM66, and the second node N66 continuously maintains the boosted voltage VPP.

In the SWD control signal generator PXID_GEN, one (118) of sub memory cell arrays 116 and 118 (FIG. 4) sharing a sense amplifier SA (FIG. 4) receives the first isolation signal BISL for a connection with the sense amplifier SA, and so the first sub word line drive control signal PXIDL has a boosted voltage VPP, the first sub word line drive control signal PXIDL being for driving sub word line drivers SWDL0 and SWDL1 (FIG. 4) corresponding to the sub memory cell array 118 shown in FIG. 4. Sub memory cell array 116 shown in FIG. 4 receives the second isolation signal BISR and so the second sub word line drive control signal PXIDR has a ground voltage VSS, the second sub word line drive control signal PXIDR being for driving sub word line drivers SWDR0 and SWDR1 (FIG. 4) corresponding to the sub memory cell array 116 of FIG. 4. In this case, the fourth P-type MOS transistor PM66 continuously provides boosted voltage VPP to the second node N66 so that the second sub word line drive control signal PXIDR maintains a low level. In this way, a voltage of the second node N66 can be prevented from falling below a certain voltage level, and so the second sub word line drive control signal PXIDR can be prevented from having a boosted voltage VPP.

With reference to FIGS. 4 to 6, an SWD control method will be described as follows.

A method of controlling sub word line drivers SWD by using sub word line drive control signals PXIDL and PXIDR in a semiconductor memory device employing a shared sense amplifier system, includes applying a sub word line drive control signal PXIDL to word line drivers SWD corresponding to a sub memory cell array that is connected to a sense amplifier SA by using isolation signals BISL, BISR; and applying a sub word line drive control signal PXIDR without applying the sub word line drive control signal PXIDL, to sub word line drivers corresponding to the rest of the sub memory cell array that is not connected to the sense amplifier.

As already described above, the isolation signals BISL and BISR correspond respectively to a first isolation signal BISL that connects one of sub memory cell arrays 116 and 118 sharing the sense amplifier SA with the sense amplifier; and a second isolation signal BISR that disconnects the rest of the sub memory cell array from the sense amplifier SA.

As described above according to the first exemplary embodiment, the SWD control method of the invention includes receiving the second isolation signal BISR, and applying the sub word line drive control signal PXIDL to sub word line drivers SWDL0 and SWDL1 corresponding to sub memory cell array 118 that is connected to the sense amplifier SA; and receiving the first isolation signal BISL and applying the sub word line drive control signal PXIDR to sub word line drivers SWDR0 and SWDR1 corresponding to sub memory cell array 116 that is disconnected from the sense amplifier SA.

As described above according to the second exemplary embodiment of the invention, the SWD control method includes receiving the first isolation signal BISL, and applying the sub word line drive control signal PXIDL to sub word line drivers SWDL0 and SWDL1 corresponding to sub memory cell array 118 that is connected to the sense amplifier SA; and receiving the second isolation signal BISR and applying the sub word line drive control signal PXIDR to sub word line drivers SWDR0 and SWDR1 corresponding to sub memory cell array 116 that is disconnected from the sense amplifier SA.

By using an SWM control signal generator of a semiconductor memory device according to an exemplary embodiment of the invention, sub word line drivers corresponding to a sub memory cell array connected to a sense amplifier can be controlled to distinguish from sub word line drivers corresponding to a sub memory cell array that is disconnected from a sense amplifier. Hence a load of the SWD control signal generator can be reduced.

As described above, according to an exemplary embodiment of the invention, a semiconductor memory device having a sub word line driver control signal generator controlled by an isolation signal reduces a load of the sub word line driver control signal generator.

Further, a load of sub word line driver control signal generator can be reduced without using specific signals other than isolation signals.

In addition, power consumption in operating a semiconductor memory device can be substantially reduced as the load of sub word line driver control signal generator is reduced. In particular, operation characteristics of a mobile system, etc. requiring a low power consumption environment can be enhanced.

Embodiments of the invention may be practiced in many ways. What follows are exemplary, non-limiting descriptions of some of these embodiments.

According to one aspect of the invention, a semiconductor memory device having a sub word line driver that selectively connects one of sub word lines with a main word line and applies a boosted voltage having a level higher than power source voltage to a selected sub word line, comprises a sub word line driver control signal generator, which receives an isolation signal applied to electrically isolate a sense amplifier from a bit line connected to memory cells constituting a memory cell array of the semiconductor memory device, and which generates a driver control signal for deciding whether the sub word line driver operates or not.

The sub word line driver control signal generator may not operate a sub word line driver corresponding to a memory cell connected to a bit line that is electrically isolated by the isolation signal.

According to another aspect of the invention, a semiconductor memory device having a structure that sub memory cell arrays share a sense amplifier, the sub memory cell arrays having a structure that a plurality of unit memory cells are arrayed in a matrix type, comprises a bit line isolation part, sub word line drivers and sub word line driver control signal generator.

The bit line isolation part is controlled by an isolation signal, and is disposed adjacent to the sense amplifier, to isolate between the sense amplifier and one of sub memory cell arrays sharing the sense amplifier.

The sub word line drivers apply a sub word line voltage to a corresponding sub word line in selecting memory cells connected to the corresponding sub word line, and are allocated and disposed respectively corresponding to sub memory cell arrays that share the sense amplifier.

The sub word line driver control signal generator receives a sub word line decoding signal to select a corresponding sub word line and the isolation signal, and activates one of the sub word line drivers corresponding to a sub memory cell array coupled with the sense amplifier, and deactivates the rest of the sub word line drivers.

The sub word line driver control signal generator can be formed in a conjunction region adjacent to a region where the sense amplifier is formed.

The sub word line driver control signal generator can include a boosted voltage supply part for outputting a boosted voltage having a level higher than power source voltage when the sub word line decoding signal has a high level.

The sub word line driver control signal generator can include a first sub word line drive control signal output part.

The first sub word line drive control signal output part receives a second isolation signal among the isolation signals through a gate terminal of a first P-type MOS transistor, the second isolation signal being for insulating between sub memory cell arrays sharing the sense amplifier and the sense amplifier.

In the first sub word line drive control signal output part, an output voltage of the boosted voltage supply part is applied to a source terminal of the first P-type MOS transistor, and a drain terminal of the first P-type MOS transistor is connected to a drain terminal of a first N-type MOS transistor.

In the first sub word line drive control signal output part, an inversion signal of the sub word line decoding signal is applied to a gate terminal of the first N-type MOS transistor, and a ground voltage is applied to a source terminal of the first N-type MOS transistor.

The first sub word line drive control signal output part outputs a voltage of first node provided between a drain terminal of the first P-type MOS transistor and a drain terminal of the first N-type MOS transistor.

Further, the sub word line driver control signal generator can include a second sub word line drive control signal output part.

The second sub word line drive control signal output part receives a first isolation signal among the isolation signals through a gate terminal of a second P-type MOS transistor, the first isolation signal being for connecting between sub memory cell arrays sharing the sense amplifier and the sense amplifier.

In the second sub word line drive control signal output part, an output voltage of the boosted voltage supply part is applied to a source terminal of the second P-type MOS transistor, and a drain terminal of the second P-type MOS transistor is connected to a drain terminal of a second N-type MOS transistor.

In the second sub word line drive control signal output part, an inversion signal of the sub word line decoding signal is applied to a gate terminal of the second N-type MOS transistor, and a ground voltage is applied to a source terminal of the second N-type MOS transistor.

The second sub word line drive control signal output part outputs a voltage of second node provided between a drain terminal of the second P-type MOS transistor and a drain terminal of the second N-type MOS transistor.

The sub word line driver control signal generator can include a first floating preventing part for preventing a floating of the first node, and a second floating preventing part for preventing a floating of the second node.

The first floating preventing part supplies a ground voltage to the first node when the first P-type MOS transistor is not turned on, and the second floating preventing part supplies a ground voltage to the second node when the second P-type MOS transistor is not turned on.

The second floating preventing part can be controlled by the second isolation signal.

According to another aspect of the invention, a semiconductor memory device having a structure that sub memory cell arrays share a sense amplifier, the sub memory cell arrays having a structure that a plurality of unit memory cells are arrayed in a matrix type, comprises a sub word line driver control signal generator.

The sub word line driver control signal generator responds to a first isolation signal that is performed to connect between one of sub memory cell arrays sharing a sense amplifier with the sense amplifier, and to a second isolation signal to disconnect between another sub memory cell array from the sense amplifier, and also generates a sub word line drive control signal to activate one of sub word line drivers corresponding to a sub memory cell array coupled with the sense amplifier, in response to a sub word line decoding signal to select a corresponding sub word line.

The sub word line driver control signal generator can include a first sub word line drive control signal output part and a second sub word line drive control signal output part.

The first sub word line drive control signal output part receives the first isolation signal, and provides a first sub word line drive control signal to sub word line drivers corresponding to a sub memory cell array coupled with the sense amplifier; and a second sub word line drive control signal output part receives the second isolation signal, and provides a second sub word line drive control signal to sub word line drivers corresponding to a sub memory cell array except a sub memory cell array connected to the sense amplifier.

The first sub word line drive control signal output part can include a first N-type MOS transistor that is turned on by the first isolation signal when the sub word line decoding signal has a high level so that a first node has a ground voltage, the first node being a node between a drain terminal of a first P-type MOS transistor and a drain terminal of a second P-type MOS transistor; and a first inverter for inverting a voltage of the first node and outputting the first sub word line drive control signal.

The sub word line decoding signal is applied to a gate terminal of the first P-type MOS transistor, and a boosted voltage having a level higher than a power source voltage is applied to a source terminal thereof. The first sub word line drive control signal is applied to a gate terminal of the second P-type MOS transistor, and a boosted voltage is applied to a source terminal.

The first node has a boosted voltage when the sub word line decoding signal has a low level, thus the first sub word line drive control signal can become a low level.

The second sub word line drive control signal output part can include a second N-type MOS transistor that is turned off by the second isolation signal when the sub word line decoding signal has a high level so that a second node has a boosted voltage, the second node being a node between a drain terminal of a third P-type MOS transistor and a drain terminal of a fourth P-type MOS transistor; and a second inverter for inverting a voltage of the second node and outputting the second sub word line drive control signal.

The sub word line decoding signal is applied to a gate terminal of the third P-type MOS transistor, and a boosted voltage having a level higher than a power source voltage is applied to a source terminal thereof. The second sub word line drive control signal is applied to a gate terminal of the fourth P-type MOS transistor, and a boosted voltage is applied to a source terminal.

The second node has a boosted voltage when the sub word line decoding signal has a low level, thus the second sub word line drive control signal can become a low level.

According to another aspect of the invention, in a semiconductor memory device having a sub word line driver for selectively connecting one of sub word lines with a main word line and applying a boosted voltage having a level higher than a power source voltage to a selected sub word line, a method of controlling the sub word line driver comprises deciding whether the sub word line driver operates or not, by using a bit line connected to memory cells constituting a memory cell array of the semiconductor memory device, and an isolation signal applied to electrically isolate sense amplifiers.

According to another aspect of the invention, in a semiconductor memory device having a structure that sub word line drivers are allocated and disposed individually corresponding to sub memory cell arrays sharing a sense amplifier, the sub word line drivers being for applying a sub word line voltage to a corresponding sub word line when a sub word line connected to a corresponding memory cell is selected; a method of controlling the sub word line drivers by using a sub word line driver control signal comprises responding to a first isolation signal and a second isolation signal, the first isolation signal being for connecting between a sub memory cell array selected among sub memory cell arrays sharing the sense amplifier and the sense amplifier, and the second isolation signal being for disconnecting between an unselected sub memory cell array and the sense amplifier; and activating one of sub word lines corresponding to the selected sub memory cell array in response to a sub word line decoding signal.

It will be apparent to those skilled in the art that modifications and variations can be made in the present invention without deviating from the spirit or scope of the invention. Thus, it is intended that the present invention cover any such modifications and variations of this invention that they come within the scope of the appended claims and their equivalents. Accordingly, these and other changes and modifications are seen to be within the true spirit and scope of the invention as defined by the appended claims.

We claim:

1. A semiconductor memory device having a structure that sub memory cell arrays share a sense amplifier, the sub memory cell array having a plurality of unit memory cells arrayed in a matrix type, the device comprising:
    a bit line isolation part, which is controlled by an isolation signal and is disposed adjacent to the sense amplifier, to isolate the sense amplifier from one of sub memory cell arrays sharing the sense amplifier;
    multiple sub word line drivers, which are allocated and respectively correspond to the sub memory cell arrays that share the sense amplifier; and
    a sub word line driver control signal generator for receiving a sub word line decoding signal to select a corresponding sub word line of a selected sub memory cell array, and the isolation signal, and so activating one of the sub word line drivers corresponding to a sub memory cell array coupled with the sense amplifier, and for deactivating the rest of the sub word line drivers, wherein the sub word line driver control signal generator is formed at a conjunction region adjacent to a region where the sense amplifier is formed, comprises a boosted voltage supply part for outputting a boosted voltage having a level higher than a power source voltage when the sub word line decoding signal has a high level, and further comprises a first sub word line drive control signal output part, in which:
        a second isolation signal among the isolation signals is applied to a gate terminal of a first P-type metal oxide semiconductor (MOS) transistor, the second isolation signal being for isolating between a sub memory cell array sharing the sense amplifier and the sense amplifier,
        an output voltage of the boosted voltage supply part is applied to a source terminal of the first P-type MOS transistor,
        a drain terminal of the first P-type MOS transistor is connected to a drain terminal of a first N-type MOS transistor,
        an inversion signal of the sub word line decoding signal is applied to a gate terminal of the first N-type MOS transistor,
        a ground voltage is applied to a source terminal of the first N-type MOS transistor, and
        a voltage of a first node between the drain terminal of the first P-type MOS transistor and the drain terminal of the first N-type MOS transistor is outputted.

2. The device of claim 1, wherein the sub word line driver control signal generator comprises a second sub word line drive control signal output part, in which:
    a first isolation signal among the isolation signals is applied to a gate terminal of a second P-type MOS transistor, the first isolation signal being for connecting between a sub memory cell array sharing the sense amplifier and the sense amplifier,
    an output voltage of the boosted voltage supply part is applied to a source terminal of the second P-type MOS transistor,
    a drain terminal of the second P-type MOS transistor is connected to a drain terminal of a second N-type MOS transistor,
    an inversion signal of the sub word line decoding signal is applied to a gate terminal of the second N-type MOS transistor,
    a ground voltage is applied to a source terminal of the second N-type MOS transistor, and
    a voltage of second node between the drain terminal of the second P-type MOS transistor and the drain terminal of the second N-type MOS transistor is outputted.

3. The device of claim 2, wherein the sub word line driver control signal generator comprises:
    a first floating preventing part for preventing a floating of the first node; and
    a second floating preventing part for preventing a floating of the second node.

4. The device of claim 3, wherein the first floating preventing part supplies a ground voltage to the first node when the first P-type MOS transistor is not turned on.

5. The device of claim 4, wherein the second floating preventing part supplies a ground voltage to the second node when the second P-type MOS transistor is not turned on.

6. The device of claim 5, wherein the second floating preventing part is controlled by the second isolation signal.

* * * * *

UNITED STATES PATENT AND TRADEMARK OFFICE
CERTIFICATE OF CORRECTION

PATENT NO. : 7,551,513 B2
APPLICATION NO. : 11/342161
DATED : June 23, 2009
INVENTOR(S) : Hong-Goo Yoon et al.

It is certified that error appears in the above-identified patent and that said Letters Patent is hereby corrected as shown below:

Column 1, line 51, the word "SWE" should read -- SWD --;
Column 4, line 27, the word "SWE" should read -- SWD --;
Column 4, line 43, the word "|VDD|" should read -- VDD --;
Column 6, line 4, the word "|the" should read -- the --;
Column 6, line 6, the word "|and" should read -- and --;
Column 6, line 29, the word "|For" should read -- For --;
Column 6, line 36, the word "|In" should read -- In --;
Column 6, line 39, the word "|connecting" should read -- connecting --;
Column 6, line 62, the word "|with|" should read -- with --;
Column 7, line 51, the word "|disconnected" should read -- disconnected --;
Column 10, line 4, the word "SWM" should read -- SWD --.

Signed and Sealed this

Twenty-seventh Day of October, 2009

David J. Kappos
*Director of the United States Patent and Trademark Office*